(12) United States Patent
Regnier et al.

(10) Patent No.: US 7,829,449 B2
(45) Date of Patent: Nov. 9, 2010

(54) PROCESS FOR FABRICATING AN ELECTRONIC INTEGRATED CIRCUIT AND ELECTRONIC INTEGRATED CIRCUIT THUS OBTAINED

(75) Inventors: Christophe Regnier, Du Touvet (FR); Aurelie Humbert, Paris (FR)

(73) Assignees: STMicroelectronics (Crolles 2) SAS, Crolles Cedex (FR); Koninklijke Phillips Electronics N.V., Eindhoven (NL)

( * ) Notice: Subject to any disclaimer, the term of this patent is extended or adjusted under 35 U.S.C. 154(b) by 996 days.

(21) Appl. No.: 10/589,275

(22) PCT Filed: Feb. 10, 2005

(86) PCT No.: PCT/FR2005/000318
§ 371 (c)(1),
(2), (4) Date: Aug. 10, 2006

(87) PCT Pub. No.: WO2005/078785
PCT Pub. Date: Aug. 25, 2005

(65) Prior Publication Data
US 2007/0170538 A1 Jul. 26, 2007

(30) Foreign Application Priority Data
Feb. 13, 2004 (FR) .................... 04 01482

(51) Int. Cl.
*H01L 21/3205* (2006.01)
(52) U.S. Cl. ............ 438/589; 438/621; 438/319; 438/667; 438/660; 438/422; 438/674; 438/618; 257/532; 257/499; 257/E21.008

(58) Field of Classification Search ............... 257/532, 257/492, 499, E21.008; 438/621, 319, 589, 438/667, 660, 422, 674, 618
See application file for complete search history.

(56) References Cited
U.S. PATENT DOCUMENTS
5,296,408 A * 3/1994 Wilbarg et al. ............. 216/2
(Continued)

FOREIGN PATENT DOCUMENTS
EP 1191557 A 3/2002
(Continued)

OTHER PUBLICATIONS
Sugiyama, et al. "Micron-diaphragm pressure sensor" International Electron Devices Meeting, Dec. 7, 1986 pp. 184-187 XP002039418.
(Continued)

*Primary Examiner*—Lynne A Gurley
*Assistant Examiner*—Junghwa M Im
(74) *Attorney, Agent, or Firm*—Gardere Wynne Sewell LLP

(57) ABSTRACT

An electronic integrated circuit is fabricated by forming on a substrate, of which a part is composed of absorbing material, a portion made of a sacrificial material. The sacrificial material includes cobalt, nickel, titanium, tantalum, tungsten, molybdenum, gallium, indium, silver, gold, iron and/or chromium. A rigid portion is then formed in fixed contact with the substrate, on one side of the portion of sacrificial material opposite to the part of the substrate composed of absorbing material. The circuit is heated such that the sacrificial material is absorbed into the part of the substrate composed of absorbing material. A substantially empty volume is thus created in place of the portion of sacrificial material. The volume that is substantially empty can replace a dielectric material situated between the electrodes of a capacitor.

18 Claims, 2 Drawing Sheets

U.S. PATENT DOCUMENTS

| | | | |
|---|---|---|---|
| 5,666,000 A | | 9/1997 | Dusablon et al. |
| 6,140,200 A | * | 10/2000 | Eldridge ..................... 438/396 |
| 6,147,000 A | * | 11/2000 | You et al. .................. 438/687 |
| 2002/0068430 A1 | | 6/2002 | Eldridge |
| 2003/0234423 A1 | | 12/2003 | Bul et al. |

FOREIGN PATENT DOCUMENTS

| | | | |
|---|---|---|---|
| EP | 1209738 A | 5/2002 | |
| WO | WO 03/103029 | 12/2003 | |

OTHER PUBLICATIONS

International Search Report from PCT/FR2005/000318 dated May 31, 2005.

* cited by examiner

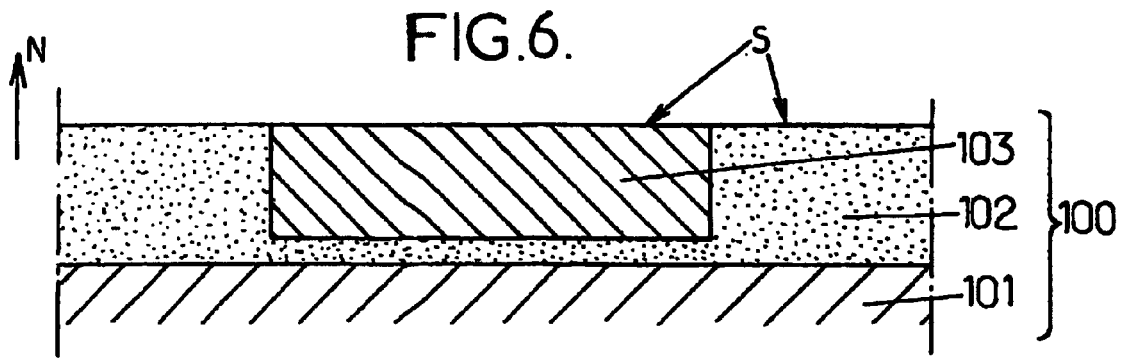
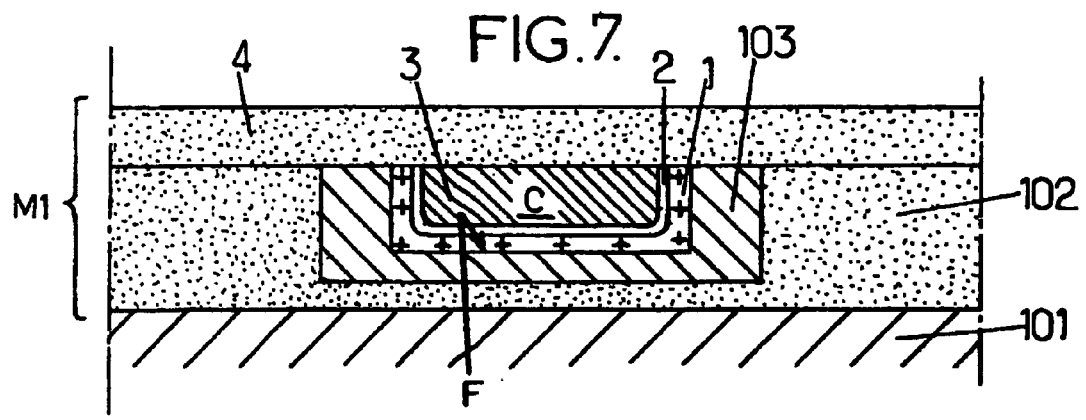
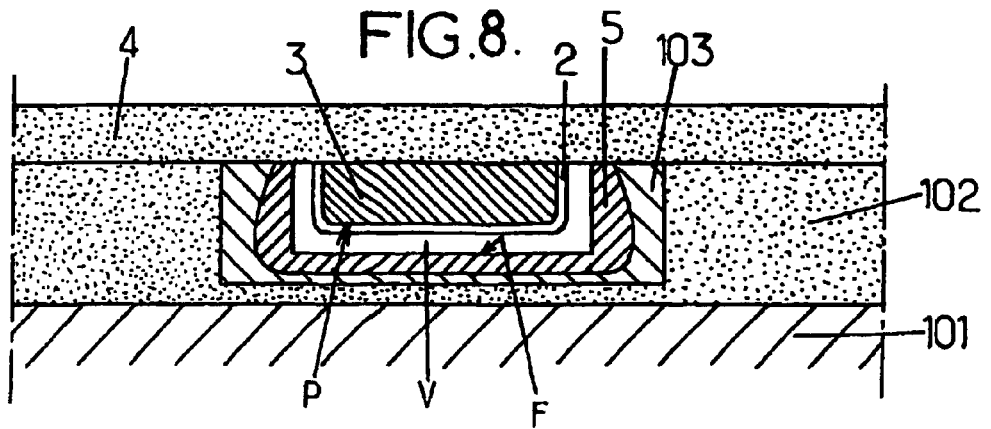

PROCESS FOR FABRICATING AN ELECTRONIC INTEGRATED CIRCUIT AND ELECTRONIC INTEGRATED CIRCUIT THUS OBTAINED

PRIORITY CLAIM

This application is a filing under 37 U.S.C. 371 from PCT/FR2005/000318 filed Feb. 10, 2005, which claims priority from French Application for Patent No. 04 01482 filed Feb. 13, 2004, the disclosures of which are hereby incorporated by reference.

BACKGROUND OF THE INVENTION

Technical Field of the Invention

The present invention relates to a process for fabricating an electronic integrated circuit that incorporates a volume substantially empty of material. It also relates to an electronic integrated circuit thus fabricated.

U.S. Pat. No. 5,296,408 describes a process for forming an empty cavity within an integrated circuit, in order to build various electronic components such as a light source, a detector, a transistor or a vacuum tube. According to this process, an absorption of aluminum into silicon is caused by heating, so as to create the cavity empty of material, whose form can be predetermined.

One drawback of the process described in U.S. Pat. No. 5,296,408 results from the chemical reactivity and the relatively low melting point of aluminum. Indeed, if the circuit temperature exceeds around 400-450° C. before the aluminum is absorbed into the silicon, chemical reactions take place between the aluminum and materials deposited close to the aluminum in the circuit. This is especially the case for silicon into which the aluminum is to be absorbed. This then interferes with the definitive absorption of the aluminum into the silicon, and the formation of the cavity is not well controlled.

There is accordingly a need for a process for fabricating a cavity within an electronic integrated circuit which does not have the above-mentioned drawbacks.

SUMMARY OF THE INVENTION

In accordance with an embodiment of the invention, a process for fabricating an electronic integrated circuit comprises the steps of:

a) forming, on a substrate of the circuit, of which a part is composed of absorbing material, a portion made of a sacrificial material coming into contact with one face of the part of the substrate composed of absorbing material;

b) forming a rigid portion in fixed contact with the substrate, on one side of the portion of sacrificial material opposite to said face of the part of the substrate composed of absorbing material; and c) heating the circuit in order to create a volume substantially empty of material by absorption of the sacrificial material into the part of the substrate composed of absorbing material, wherein the sacrificial material has a melting point in excess of 900° C. and wherein the sacrificial material is chosen so as not to cause any material alteration of parts of the circuit in contact with the portion of sacrificial material prior to the step c).

Thanks to the choice of sacrificial materials, which is an aspect of the present invention, step c) is well controlled. A volume substantially empty of material is obtained whose form and dimensions can be precisely controlled. A process according to the invention is, consequently, compatible with integrated circuit fabrication technologies corresponding to transistor gate widths equal to or less than 0.18 microns, and notably equal to 90 or 65 nm.

In step c), all the sacrificial material of the corresponding portion is preferably absorbed into the part of the substrate composed of absorbing material. An improved reproducibility of the form and dimensions of the volume substantially empty of material is thus obtained. Nevertheless, only a part of the sacrificial material can be absorbed, such that, after step c) is complete, a part of the portion of sacrificial material subsists in the circuit.

One advantage of the process of the invention resides in the fact that no extraction of the sacrificial material from the circuit is necessary. The circuit heating step c) for creating the empty volume is especially easy to implement. It does not require any access to the portion of sacrificial material, nor any use of wet or plasma etching processes.

In particular, the absorption of the sacrificial material into the part of the substrate composed of absorbing material, in the step c), can result from a chemical reaction between the sacrificial material and the absorbing material.

Another advantage of the process of the invention resides in the fact that, once steps a) and b) have been carried out, step c) can be carried out at any later point during the circuit fabrication process. For example, fabrication steps for parts of the circuit other than the electronic component which involves the volume substantially empty of material can be carried out between steps a) and b), on the one hand, and step c) on the other. This is especially advantageous when some of these fabrication steps of other parts of the circuit involve mechanical forces on the circuit. Step c) is then carried out after these steps, such that the circuit does not yet have any empty volume when it is subject to the mechanical forces. The risk of damaging or breaking the circuit during its fabrication is thus reduced, this risk being due to the presence of empty volumes within the circuit.

Advantageously, the process further comprises, between steps a) and b), the formation of an intermediate layer, said intermediate layer being located, when step b) is complete, between the portion of sacrificial material and the rigid portion. Such an intermediate layer can have several functions. One of these functions may be the improvement of the formation of the rigid portion. A smoother surface of the rigid portion can thus be obtained, which leads to a more uniform, and more complete, absorption of the sacrificial material in the step c). Another function of the intermediate layer is to contribute to a chemical isolation of the portion of sacrificial material, in order to avoid the sacrificial material being altered by atoms originating from other parts of the circuit.

The sacrificial material may include cobalt, nickel, titanium, tantalum, tungsten, molybdenum, silver, gold, iron and/or chromium.

The absorbing material may include silicon, germanium, phosphorus, arsenic and/or antimony. It may also potentially comprise selenium and/or tellurium.

In one particular embodiment of the invention, the portion of sacrificial material is formed in a cavity below the level of a surface of the substrate. The rigid portion can then cover, in a continuous fashion, the portion of sacrificial material in the cavity and the substrate outside the cavity.

The volume substantially empty of material can have different forms and can be oriented in various ways with respect to the substrate. In particular, it can have a large cross section substantially parallel to a substrate surface.

According to implementation of the invention, the volume substantially empty of material is situated between two electrodes of a capacitor forming part of the circuit. At least a part of the material situated between the electrodes of the capacitor is thus replaced by the empty volume formed in place of the portion of sacrificial material. This empty volume provides the capacitor with certain particular electrical characteristics, notably a high breakdown voltage and a high leakage resistance.

For a given breakdown voltage, a capacitor having an empty cavity thus obtained can have a reduced gap between its two electrodes. For a given constant capacitance, the capacitor dimensions can then be reduced, which allows a greater integration level of the circuit to be achieved.

Advantageously, the rigid portion comprises a first of the capacitor electrodes. The part of the substrate composed of absorbing material, following the absorption of the sacrificial material in step c), can comprise a second of the capacitor electrodes. The material of this second electrode is therefore directly formed during step c), without an additional step for deposition of a new material onto the circuit. Therefore, the fabrication process of the capacitor is simplified, which contributes to a reduction in the price of the electronic circuit.

Depending on the configuration of the capacitor, at least one of the two electrodes of the capacitor can have a main surface substantially parallel to the substrate surface.

An embodiment of the invention also relates to an electronic integrated circuit fabricated using a process such as that described above. In particular, the volume substantially empty of material can be located within a layer of metallization level of the circuit.

In accordance with another embodiment of the invention, a process is presented for forming an integrated circuit wherein a cavity is formed in an absorbing material layer. A sacrificial layer is then deposited in the cavity, the sacrificial layer having a melting point in excess of a temperature used for circuit component fabrication heating. The cavity is then filled with a fill material. The integrated circuit is subsequently heated to a temperature sufficient to cause the sacrificial layer to be absorbed into the absorbing material layer and leave a void between the absorbing material layer and the fill material.

In accordance with another embodiment, an integrated circuit comprises an absorbing material layer into which a cavity has been formed. A fill layer nearly fills the cavity and a void is provided between the fill layer and a bottom of the cavity by having the absorbing material layer at the bottom of cavity include an absorbed region where it has absorbed a sacrificed sacrificial layer whose absence creates the void.

BRIEF DESCRIPTION OF THE DRAWINGS

Other characteristics and advantages of the invention will become further apparent on reading the description which follows. The latter is purely illustrative and should be read in conjunction with the appended drawings, in which:

FIGS. 6 to 8 illustrate various steps of a second embodiment of a process for fabricating an electronic integrated circuit according to the invention.

DETAILED DESCRIPTION OF THE DRAWINGS

Figure 1:
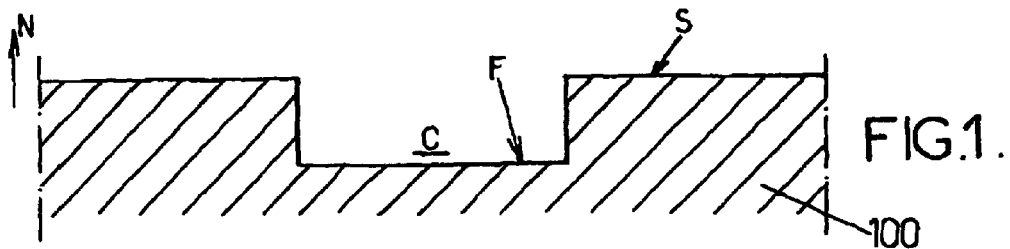
FIGS. 1 to 5 illustrate various steps of a first embodiment of a process for fabricating an electronic integrated circuit according to the invention.

The invention is now described in detail in the framework of the fabrication of an electronic integrated circuit comprising a capacitor of the Metal-Insulator-Metal type (or MIM capacitor). An MIM capacitor usually comprises two metallic electrodes and a portion of a dielectric material deposited between the two electrodes. By using a process according to the invention, at least a part of this portion of dielectric material can be replaced by a volume substantially empty of material.

In the figures, for reasons of clarity, the dimensions of the various parts of electronic components shown are not shown to scale. These figures are cross-sectional views of a substantially planar substrate on which is built an MIM-type capacitor. The cross-sectional views are considered to be in a plane perpendicular to the substrate surface. The substrate is placed in the lower part of the drawing in each figure, and N denotes a direction perpendicular to the surface of the substrate oriented towards the top of the figures. In the following description, terms such as "above", "below", "top" and "bottom" are used with reference to this orientation. In addition, identical references correspond to identical elements over all the figures.

In the following, the elementary process steps in the fabrication of an electronic integrated circuit that are familiar to a person skilled in the art are not described in detail. Only a succession of elementary steps involved in the fabrication of a circuit according to the process of the invention will be described.

First of all, a first embodiment is described according to which the capacitor is fabricated below the level of the top surface of the semiconductor substrate of an electronic integrated circuit. In this first embodiment, the semiconductor material of the substrate constitutes the absorbing material.

According to FIG. 1, a substrate 100 made of semiconductor material has a substantially planar top surface S. A cavity C is formed in the substrate 100, below the level of the surface S. The depth of the cavity C in the N direction can be, for example, equal to around 0.5 microns.

Figure 2:
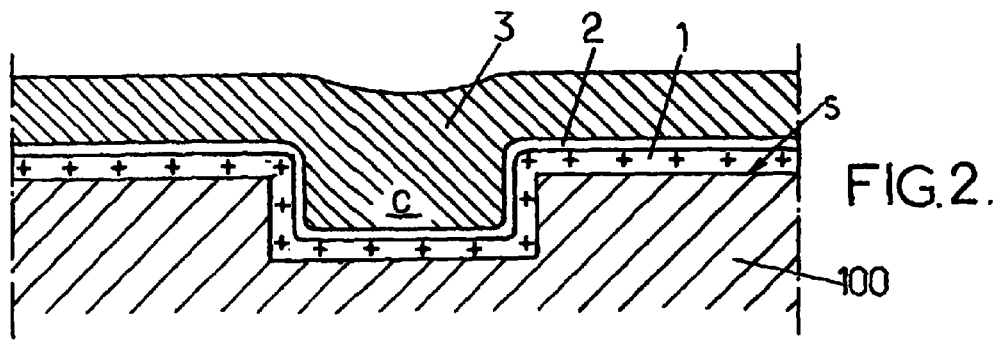

A first layer 1 of a sacrificial material, a second layer 2, called an intermediate layer, then a third layer 3 of an electrically conducting material are deposited successively on the substrate 100, into the cavity C and onto the surface S outside of the cavity C. The respective thicknesses of the layers 1 and 2 are chosen such that the layers 1 and 2 each form a conformal coating of the side walls of the cavity C. The thickness of the layer 3 is chosen so as to fill the cavity C. The configuration of the circuit shown in FIG. 2 is thus obtained. The layer 1 is in contact with the substrate 100 at the bottom F of the cavity C, as well as on the side walls of the cavity C. Thicknesses of the layers 1, 2 and 3 can be, respectively, around 20 nm, 5 nm and 1 micron.

Figure 3:
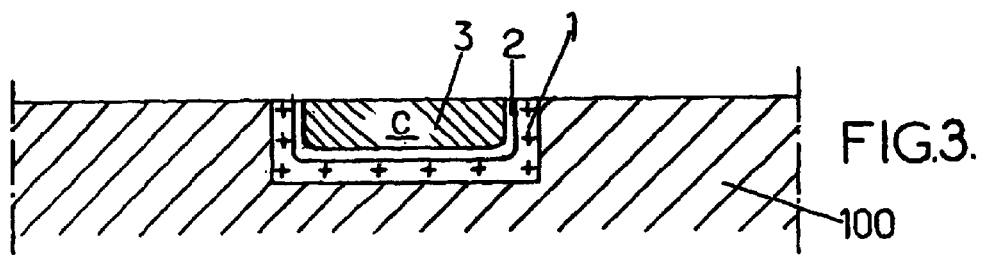

The upper surface of the circuit is then polished down to just below the level of the surface S outside of the cavity C. The only remaining portions of the layers 1-3 are then within the cavity C (FIG. 3).

The material of the layer 1 is chosen for its property allowing it to be later absorbed into the substrate 100 through the bottom F of the cavity C. For this reason, the material of the layer 1 is known as sacrificial material. The material of the layer 1 may comprise, for example, cobalt (Co), nickel (Ni), titanium (Ti), tantalum (Ta), tungsten (W), molybdenum (Mo), gallium (Ga), indium (In), silver (Ag), gold (Au), iron (Fe) and/or chromium (Cr). The semiconductor material of the substrate 100, into which the material of the layer 1 will be later absorbed, may comprise silicon (Si), germanium (Ge), phosphorus (P), arsenic (As), antimony (Sb), selenium (Se) and/or tellurium (Te).

Preferably, the substrate 100 material is silicon-based and the sacrificial material of the layer 1 is cobalt-based. Thus, the depositions of the layers 1 to 3 can easily be carried out in the front-end part of a production line for the integrated circuit, using one of the known processes for the deposition of cobalt.

The remaining portion of the layer 3 is designed to form a first electrode, or top electrode, of the capacitor. For this purpose, the material of the layer 3 can be a metal that exhibits a high electrical conductivity, such as, for example, tungsten (W). Alternatively, the material of layer 3 could also be silicon-based, suitably doped in order to have an adequate electrical conductivity.

The function of the layer 2 is to provide a good adhesion for the layer 3 onto the circuit surface. The material of the layer 2 is advantageously chosen so as to promote a progressive growth of the layer 3, with a uniform thickness. To this end, the material of the layer 2 may, notably, be titanium nitride (TiN) or tantalum nitride (TaN).

Figure 4:
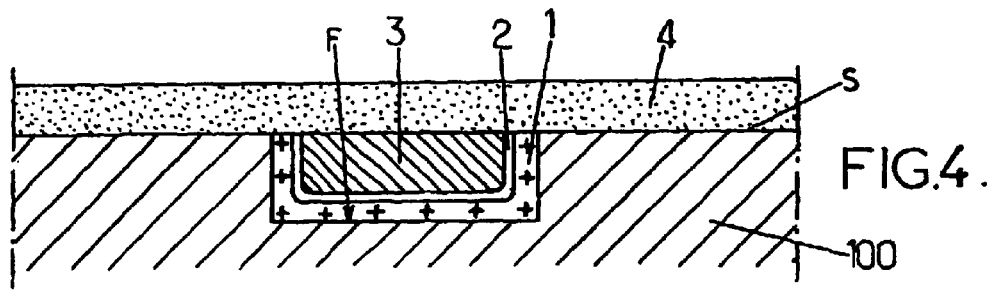

The circuit is then coated with a layer 4 of a rigid material coming into contact with the substrate 100 and with the first electrode 3 (FIG. 4). The rigid material of the layer 4 can be silica ($SiO_2$) or silicon nitride ($Si_3N_4$), for example. The layer 4 extends in a continuous fashion over the cavity C and over the substrate 100 outside of the cavity C. The layer 4 can be deposited by one of the methods known to those skilled in the art, such as, notably, CVD (Chemical Vapor Deposition).

During the deposition of the layer 4, certain reactive agents used, such as oxidizing molecules, may reach the portion 1 and alter the sacrificial material of the latter. In its altered state, it is possible that the material of the portion 1 may no longer be able to be absorbed in the material of the substrate 100. In order to avoid such an alteration of the sacrificial material of the portion 1, the intermediate layer 2 has a further function of chemically isolating the portion 1 from any reactive agents used in the formation of the layer 4. This isolation is also effective against chemical compounds used in the formation of other parts of the circuit.

Various conventional circuit fabrication steps can then be carried out. These steps may relate to, notably, the fabrication of circuit components separate from the capacitor which comprises the electrode 3, or the formation of metallization levels above the level of the surface S. In a known manner, electrical interconnects may be arranged within layers of these metallization levels according to the damascene process, or its variant dual-damascene process. It is possible for the layer 4 to be part of a first metallization level of the circuit.

Such circuit fabrication steps may involve heating of the circuit. As an example, the temperature to which the circuit is heated for densification of a portion of material is around 400-500° C. For this reason, the sacrificial material of the portion 1 may be chosen as a function of its melting point. In particular, it is chosen such that its melting point is higher than the maximum temperature that the circuit reaches during these process steps. Accordingly, metals such as cobalt ($T_{fusion}$=1495° C.), titanium ($T_{fusion}$=1640° C.) or nickel ($T_{fusion}$=1453° C.) are preferred. Indeed, they allow known processes to be used for the fabrication of circuit components, without altering the portion 1 during the circuit heating phases involved in these steps. In this way, the formation of the empty volume according to the invention can only take place after these steps.

The circuit is then heated to a temperature high enough to cause the absorption of the sacrificial material of the portion 1 into the substrate 100 material present close to the bottom F and to the side walls of the cavity C. This absorption may result from a chemical reaction between the sacrificial material and the substrate 100 material, or may result from a dissolution of the material of the portion 1 in the substrate 100 material. The respective materials of the portion 1 and of the substrate 100 are chosen such that the absorption of the sacrificial material does not cause an expansion of the material of the substrate 100 around the cavity C. In this way, the circuit will not be deformed and will retain a sufficient robustness.

Another option consists in locally heating the circuit, in other words solely within a limited portion of the circuit, in order to cause the absorption of the sacrificial material of the portion 1 into the substrate 100 material. This limited portion of the circuit that is heated includes the portion 1 and the part of the substrate 100 composed of absorbing material and situated close to the bottom F and the side walls of the cavity C. Such a local heating can be carried out, in a known manner, by means of a laser beam focused on said limited portion of the circuit.

The part of the cavity C initially occupied by the portion 1 is thus emptied: a volume V empty of material is created between the face formed by the bottom F of the cavity C and the intermediate layer 2. The layer 4 and the top electrode 3, covered with the intermediate layer 2, form a rigid portion held in position and in fixed contact with respect to the substrate 100. This rigid portion is suspended above the face F and parallel to it. For this purpose, the material of the layer 4 is chosen so as to possess a sufficient rigidity and solidity to resist any possible stress caused by the creation of the empty volume V. It has been verified by repeated testing that silica ($SiO_2$) or silicon nitride ($Si_3N_4$) are suitable to be used as materials for the layer 4.

As an example, when the substrate 100 is silicon-based and the sacrificial material of the portion 1 is cobalt-based, the absorption results from the silicidation reaction of cobalt, which is well known and perfectly controlled during the fabrication of an integrated circuit. Since the temperature to which the circuit must be heated to promote the silicidation reaction is around 800° C., existing integrated circuit production line modules can be used for the step creating the empty volume V. In addition, the heating of the circuit in order to create the empty volume V can be used to simultaneously drive silicidation reactions in other parts of the circuit, notably for electrical contacts in order to reduce, in a known manner, electrical contact resistances.

Figure 5:
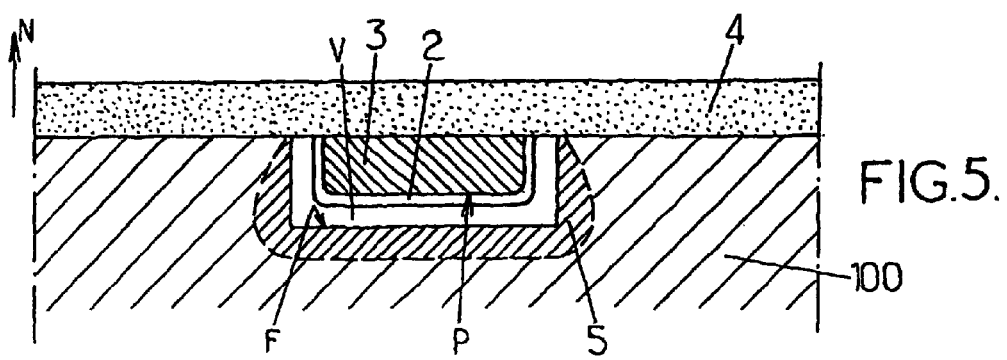

Preferably, the substrate 100 material and the sacrificial material of the portion 1 are chosen such that, following the absorption of the sacrificial material into the substrate material, the resulting material near the bottom F and the side walls of the cavity C is an electrically conducting compound. This is notably the case if cobalt silicide ($CoSi_2$) is formed. This conducting part of the substrate 100, with reference 5 in FIG. 5, forms the second electrode, or bottom electrode, of the capacitor. The two electrodes 3 and 5 are separated one from the other by the empty volume V. The volume V plays the role of the dielectric material situated between the electrodes of the capacitor obtained. It may possibly contain a certain quantity of gaseous compounds, especially vapor-state compounds originating from the substrate 100, from the layers 2 or 4, or originating by diffusion from other parts of the circuit. It is in this sense that the volume V is said to be "substantially empty".

In the first embodiment of the invention that has just been described, the capacitor configuration obtained is as follows: the volume V being substantially empty of material has a large cross section substantially parallel to the surface S of the substrate 100, and the electrodes 3 and 5 each have a main surface substantially parallel to the surface S. The thickness of the volume V in the N direction is then substantially equal to the initial thickness of the layer 1, namely around 20 nm.

In addition, an electrically insulating belt may be provided around the part 5 of the substrate 100 which constitutes the bottom electrode of the capacitor. Preferably, such an insulating belt is formed in the substrate 100 at the beginning of the capacitor fabrication process. It can be of the STI (Shallow Trench Insulation) type, or of the LOCOS (LOCal Oxidation of Silicon) type, for example.

According to a second embodiment of the process of the invention, the capacitor can be disposed within a layer of a metallization level above the top surface of the semiconductor substrate of an electronic integrated circuit. This second embodiment will now be described with reference to FIGS. 6 to 8.

According to FIG. 6, a substrate 101, made from semiconductor material, is coated with a layer 102 of an electrically insulating material. The layer 102 can, for example, be made of silica ($SiO_2$). An insert 103, for example made of silicon, is formed within the layer 102, in a limited portion of the latter. The thickness of the insert 103, in the N direction, can be equal to 0.6 microns, for example. The assembly formed by the substrate 101, the layer 102 and the insert 103 plays an identical role to that of the substrate 100 used in the first embodiment of the invention above. The reference S corresponds to the top surface of the layer 102, continuing in an uninterrupted fashion over the insert 103.

Steps identical to those corresponding to FIGS. 1-4 are executed, so as to build the capacitor within the insert 103. Thus, a cavity C is formed in a central part of the insert 103. The cavity C has a depth, measured in the N direction, that is less than the thickness of the insert 103, for example 0.5 microns. Thus, a residual thickness of around 0.1 microns is present between the bottom of the cavity C and the layer 102.

Portions 1, 2 and 3, for example respectively made of nickel (Ni), titanium nitride (TiN) and tungsten (W), as well as a layer 4 of silica ($SiO_2$) are formed in the same way as described above. The circuit configuration shown in FIG. 7 is then obtained. In this configuration, the material of the insert 103 forms the absorbing material. The face F corresponds to the bottom of the cavity C, which forms the interface between the insert 103 and the portion 1.

The layer 4 forms, together with the layer 102, a first level of metallization, denoted M1, above the substrate 101. As an option, a stopping layer, not shown here but which can be of silicon nitride ($Si_3N_4$), can be arranged between the layers 102 and 4, in order to allow interconnects to be formed in the metallization level M1 using the dual-damascene process.

The circuit is then heated to around 500° C. so as to cause the absorption of the nickel material of the portion 1 into the silicon material of the insert 103. In this second embodiment, the insert 103 material is the absorbing material. The empty volume V is thus created between the layer 2 and the insert 103. The material of the insert 103 near the volume V is transformed into nickel silicide (NiSi). This forms the bottom electrode 5 of the capacitor, situated opposite the top electrode of the capacitor formed by the portion 3. The electrodes 3 and 5 are separated by the empty volume V.

The process of the invention can be implemented in many ways during the fabrication of an MIM capacitor, by maintaining an empty volume that replaces a dielectric material disposed between the electrodes of the capacitor. In particular, in certain embodiments, the intermediate layer 2 can be eliminated. The capacitor may also have a different configuration from those of the embodiments described. In particular, configurations can be envisaged according to which the empty volume V has a large cross section substantially perpendicular to the surface S of the substrate. In this case, the capacitor electrodes can have main surfaces also oriented in a direction perpendicular to the surface S.

Generally speaking, a capacitor built using the process of the invention exhibits an especially high breakdown voltage. Indeed, the value of the breakdown voltage of a capacitor depends on the quality of the portion of dielectric material. When it is formed by the usual deposition techniques for materials used in the fabrication of integrated circuits, this portion has intrinsic defects which are the cause of breakdown in such capacitors. The replacement of at least a part of the portion of dielectric material of an MIM capacitor by a substantially empty volume, obtained by using a process according to the invention, leads to a high value for the breakdown voltage of the capacitor. The MIM capacitor can then be used for particular functions that require a high value of breakdown voltage, such as, for example, a decoupling function between several electrical power supplies connected to a circuit.

Lastly, although the invention has been described in detail in the framework of the fabrication of an MIM capacitor, it will be understood that it can be implemented for the fabrication of other components within an electronic integrated circuit.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

The invention claimed is:

1. A process for fabricating an electronic integrated circuit comprising:
   a) forming, on a substrate of the circuit, of which a part is composed of absorbing material, a portion made of a sacrificial material coming into contact with one face of the part of the substrate composed of absorbing material;
   b) forming a rigid portion in fixed contact with the substrate, on one side of the portion of sacrificial material opposite to said face of the part of the substrate composed of absorbing material; and
   c) heating the circuit in order to create a volume substantially empty of material by absorption of the sacrificial material into the part of the substrate composed of absorbing material,
   wherein the sacrificial material has a melting point in excess of 900° C. and wherein the sacrificial material is chosen so as not to cause any material alteration of parts of the circuit in contact with the portion of sacrificial material prior to c) heating.

2. The process according to claim 1, wherein the sacrificial material selected from the groups consist of cobalt, nickel, titanium, tantalum, tungsten, molybdenum, silver, gold, iron and chromium.

3. The process according to claim 1, wherein the absorbing material selected from the groups consist of silicon, germanium, phosphorus, arsenic and antimony.

4. The process according to claim 1, wherein the portion of sacrificial material is formed in a cavity below the level of a surface of the substrate.

5. The process according to claim 1, wherein, at c) heating, the absorption of the sacrificial material into the part of the substrate composed of absorbing material results from a chemical reaction between the sacrificial material and the absorbing material.

6. The process according to claim 1, wherein said volume substantially empty of material has a large cross section substantially parallel to a surface of the substrate.

7. The process according to claim 1, further comprising, between a) forming and b) forming, forming of an intermediate layer, said intermediate layer being located, when b) forming is complete, between the portion of sacrificial material and the rigid portion.

8. The process according to claim 1, wherein the volume substantially empty of material is situated between two electrodes of a capacitor belonging to said circuit.

9. The process according to claim 8, wherein the rigid portion comprises a first electrode of the capacitor.

10. The process according to claim 8, wherein the part of the substrate composed of absorbing material, after absorbing the sacrificial material in c) heating, comprises a second electrode of the capacitor.

11. The process according to claim 8, wherein at least one of the two electrodes has a main surface substantially parallel to a substrate surface.

12. The process according to claim 1, further comprising:
forming a cavity in the an absorbing material;
depositing the sacrificial material in the cavity; and
filling the cavity with a fill material.

13. The process of claim 1 wherein the absorbing material is a semiconductor substrate layer.

14. The process of claim 1 wherein the absorbing material is a layer above a semiconductor substrate layer.

15. The process of claim 1 wherein heating comprises integrated circuit heat densification.

16. The process of claim 1 wherein heating comprises using heating to not only cause the sacrificial material to be absorbed but also to drive silicidation of the integrated circuit.

17. The process of claim 1, wherein the sacrificial material includes a material selected from the group consisting of cobalt, nickel, titanium, tungsten, molybdenum, silver, gold, and iron.

18. The process of claim 12 wherein the fill material comprises an intermediate layer and an electrically conducting layer.

* * * * *